United States Patent
Menz et al.

(10) Patent No.: US 9,147,756 B2
(45) Date of Patent: Sep. 29, 2015

(54) ELECTRONIC DEVICE AND METHOD FOR INCREASING RELIABILITY OF BIPOLAR TRANSISTORS UNDER HIGH VOLTAGE CONDITIONS

(75) Inventors: Philipp Menz, Wartenberg (DE); Berthold Staufer, Moosburg (DE); Yasuda Hiroshi, Plano, TX (US)

(73) Assignee: TEXAS INSTRUMENTS DEUTSCHLAND GMBH, Freising (DE)

( * ) Notice: Subject to any disclaimer, the term of this patent is extended or adjusted under 35 U.S.C. 154(b) by 0 days.

(21) Appl. No.: 13/557,394

(22) Filed: Jul. 25, 2012

(65) Prior Publication Data

US 2013/0193557 A1 Aug. 1, 2013

(30) Foreign Application Priority Data

Jul. 25, 2011 (DE) .......................... 10 2011 108 334

(51) Int. Cl.
| | |
|---|---|
| *H01L 27/082* | (2006.01) |
| *H01L 29/00* | (2006.01) |
| *H01L 27/102* | (2006.01) |
| *H01L 29/73* | (2006.01) |
| *H01L 29/732* | (2006.01) |
| *H01L 29/10* | (2006.01) |
| *H01L 29/66* | (2006.01) |

(52) U.S. Cl.
CPC ............ *H01L 29/73* (2013.01); *H01L 29/1004* (2013.01); *H01L 29/66234* (2013.01); *H01L 29/7325* (2013.01)

(58) Field of Classification Search
CPC ...... H01L 27/082; H01L 29/00; H01L 27/102
USPC .......................................... 257/592, 558, 564
See application file for complete search history.

(56) References Cited

U.S. PATENT DOCUMENTS

| 5,548,158 A * | 8/1996 | Bulucea et al. ............... 257/592 |
| 6,355,971 B2 * | 3/2002 | Schligtenhorst et al. ...... 257/566 |
| 7,236,272 B2 * | 6/2007 | Huang et al. ................... 358/474 |

FOREIGN PATENT DOCUMENTS

| DE | 37 80 284 T2 | 1/1993 |
| EP | 1 263 052 A2 | 4/2002 |

* cited by examiner

*Primary Examiner* — Marc Armand
(74) *Attorney, Agent, or Firm* — Jacqueline J. Garner; Frank D. Cimino

(57) ABSTRACT

The invention relates to an electronic device with a bipolar transistor having an emitter, a base and a collector. The base has a first region of a first concentration of the first dopant for forming an electrically active region of the base and a second region of a second concentration of the first dopant close to the surface of the base region. The first region is separated from the second region by a region of a third concentration of the first dopant and the third concentration is lower than the first and the second concentration.

9 Claims, 3 Drawing Sheets

ELECTRONIC DEVICE AND METHOD FOR INCREASING RELIABILITY OF BIPOLAR TRANSISTORS UNDER HIGH VOLTAGE CONDITIONS

FIELD OF THE INVENTION

The invention relates to an electronic device and a method for increasing reliability of bipolar transistors under high voltage conditions.

BACKGROUND

For some applications, as, for example for hard disk writing, high speed pre-amplifier circuits are required. The bipolar transistors of these high speed preamplifier circuits are driven for a short period of time with emitter-collector voltage levels which are greater than the nominal value. However, with decreasing structure size of the bipolar transistors and/or other design changes, the desired short-time overdrive starts to seriously affect the lifetime of the transistors.

SUMMARY

It is an object of the invention to provide an electronic device and a method of manufacturing an electronic device that overcome the disadvantages of the prior art.

In one aspect of the invention, there is an electronic device comprising a bipolar transistor having an emitter, a base and a collector. The base has a first region of a first concentration of a first dopant for forming an electrically active region of the base and a second region of a second concentration of the first dopant close to the surface of the base region. The first region is separated from the second region by a region of a third concentration of the first dopant. The third concentration is lower than the first concentration and the second concentration. The second region and the first region can have a concentration of the first dopant which is in the same order of magnitude.

The invention also provides a method of manufacturing a bipolar transistor. Most of the relevant manufacturing steps may be those for manufacturing a SiGe bipolar transistor. This can also be in a silicon-on-insulator technology. The base region can be doped with a first dopant for forming an active base region having a first concentration of the first dopant. However, in addition to the conventional steps, the base region may be doped again with the first dopant for providing an additional surface doping of the base region with a second concentration of the first dopant.

The first and second doping steps can be performed such that the two doping regions are separated from each other by a region of a third concentration being lower than the first concentration and being lower then the second concentration. The third concentration can be at least an order of magnitude less than the order of magnitude of the first concentration and of the second concentration.

BRIEF DESCRIPTION OF DRAWINGS

Further aspects and characteristics of the invention will ensue from the following description of preferred embodiments of the invention with reference to the accompanying drawings, wherein.

DETAILED DESCRIPTION OF EXAMPLE EMBODIMENTS

Figure 1:
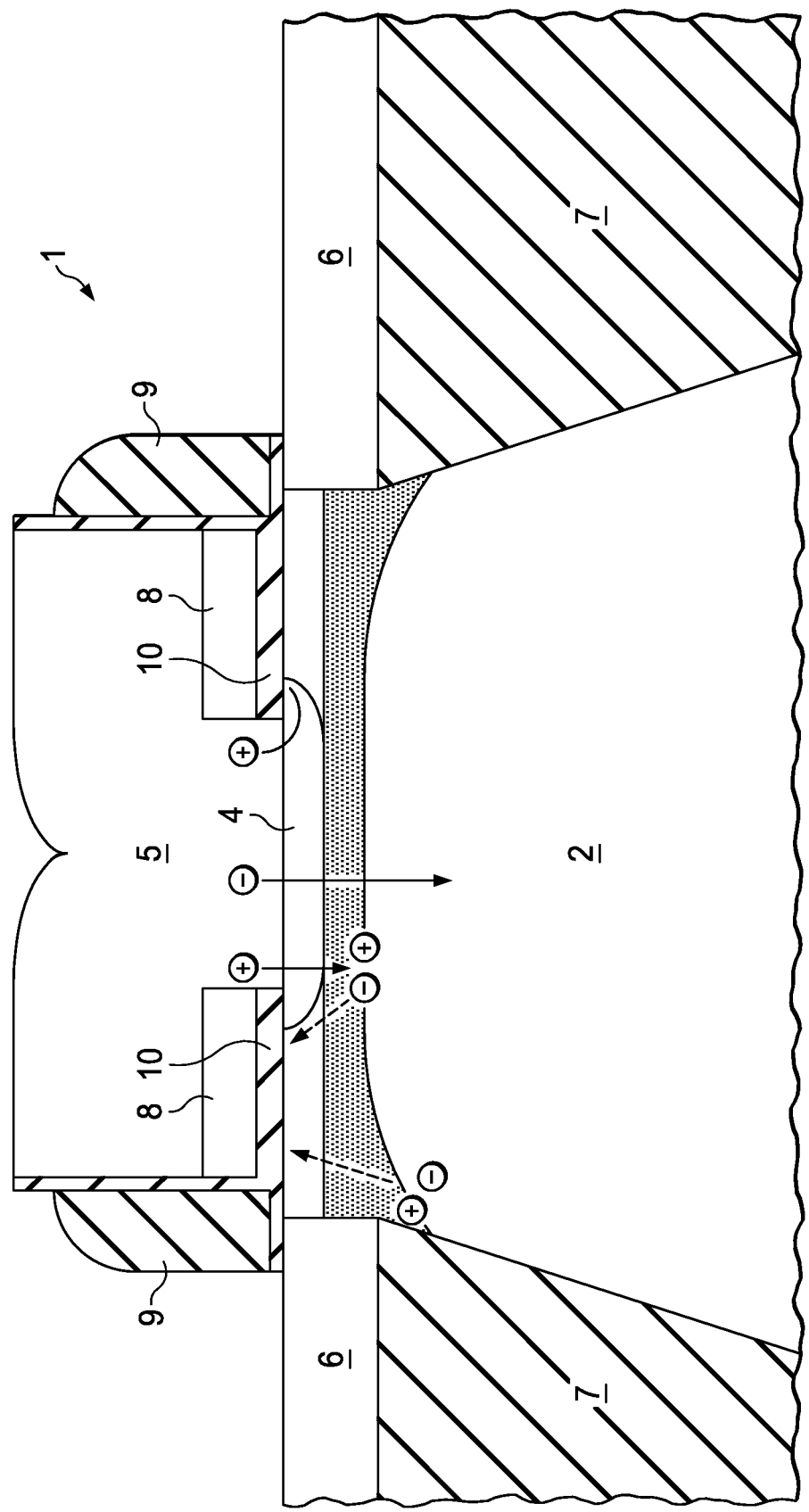
FIG. 1 is a cross-sectional diagram through a bipolar transistor according to the prior art illustrating the background of the invention.

FIG. 1 is a cross-sectional diagram through a bipolar transistor according to the prior art illustrating the background of the invention. There is a SiGe Germanium PNP bipolar transistor 1. The transistor 1 has a collector region 2, a base region 3 and an emitter region 4. There is further an emitter contact 5 and extrinsic base regions 6 for contacting the emitter region 4 and the base region 3, respectively. The shallow trenches 7 separate the transistor 1 from other transistors or components (not shown) in accordance with, for example, a typical bipolar technology (might be a silicon-on-insulator (SO!) technology) and as known by those skilled in art. The extrinsic base regions 6 are made of poly-crystalline silicon and the base region 3 is made of mono-crystalline silicon. The active region 11 of the base 3 is doped with a first dopant, which is phosphorous. The top surface of the base 3 is covered by a base (moat) oxide 10 which overlaps also the emitter region 4. In a typical application, the transistor 1 may be coupled with the emitter to ground (0 V), with the base to −0.8 V and with the collector to −7 V. In order to illustrate the situation, there are some exemplary holes (+) and electrons (−). The holes move from the emitter contact 5, through the emitter region 4 and the active base region 3 to the collector 2. However, due to the high electrical field (high voltage drop of about 6.2 V) across the PN-junction between the base region 3 and the collector 2, the holes are significantly accelerated and may therefore split electron-hole pairs (impact ionization). The holes of the split electron-hole pairs move into the collector region 2. However, the remaining electrons move towards the base oxide 10, where the electrons are trapped. If a sufficient amount of electrons is trapped in the base oxide 10, this can cause an inversion in the base region 3 (the surface of the base region 3 directly below the base oxide 10). This effect can be considered as an extension of the emitter region 4 into the base region 3. If the dimensions are large enough, this may not be relevant. However, if the dimensions are decreased, the trapped electrons may substantially affect the current gain and other parameters of the transistor 1. The trapped charge in the base oxide increases the recombination at the base (moat) oxide interface and thereby increases the base current.

To avoid this problem, the base region according to the invention has a first region of a first concentration of a first dopant for forming an electrically active region of the base and a second region of a second concentration of the first dopant close to the surface of the base region. The first region is separated from the second region by a region of a third concentration of the first dopant. The third concentration is lower than the first concentration and the second concentration. The second region and the first region can have a concentration of the first dopant which is in the same order of magnitude.

In terms of a doping profile of the first dopant along a line from the interface of the base moat oxide into the base moat, the bipolar transistor can be described as follows. The base has a doping profile of a first dopant of a first doping type. The doping profile of the first dopant has a first region of a high concentration of the first dopant for forming the electrically active region of the base. The first region of doping extends over the full base moat area, while the electrically active region of the base is only part of the base moat area. Furthermore, the doping profile of the first dopant has a second region of a high concentration of the first dopant close to the transition from the base moat to the base oxide (upper surface of the base, also referred to as base moat interface). The first region of high concentration is advantageously separated from the second region by a region of lower concentration of the first dopant. According to this aspect of the invention, the profile of the first dopant is adapted in order to have a second region of high concentration in close proximity to the boundary between emitter and base. This is based on the recognition that the amount of charges in the base oxide of the transistor can increase, if parameters, as for example the structure size of the technology, are changed. The charges in the base oxide are caused from hot carriers generated by impact ionization at the collector-base junction. The charges rise the recombination rate at the collector-base junction, increases the base current (IB) and reduces the current gain (HFE) of the transistor, especially for low collector currents (IC). A large amount of charges in the base oxide can even cause inversion underneath the base oxide. This can exacerbate the base current increase and result in large current gain drops, even at a high collector current regime. The surface doping according to aspects of the invention, i.e. the introduction of the second region of high concentration of the first dopant, prevents the inversion of the base moat silicon surface. Furthermore, the junction between the active base and the extrinsic base becomes less steep at the boundary between poly-crystalline and mono-crystalline silicon.

Figure 2:
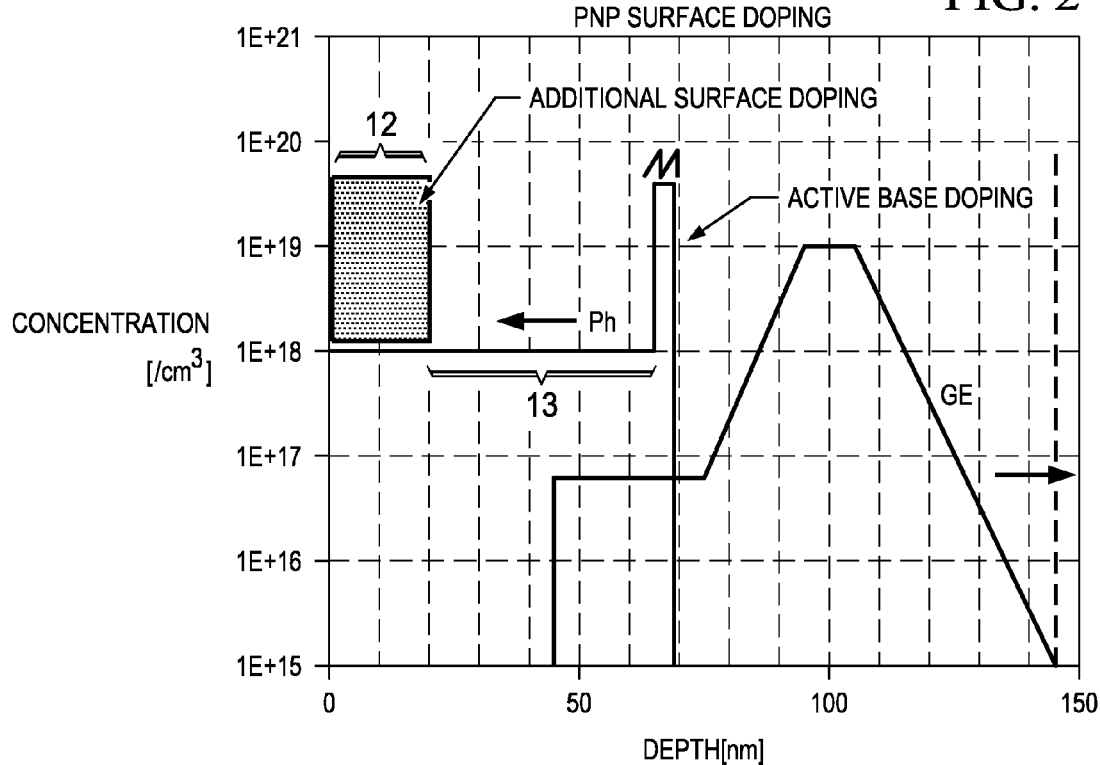
FIG. 2 is a diagram of the doping profile according to an embodiment of the invention.

A simplified diagram of the profile of the first dopant Ph (phosphorous) for one embodiment is shown in FIG. 2. There are two regions 11 and 12, in which the concentration of the first dopant (Ph) is increased. The left side of the diagram at 0 nm corresponds to the boundary between the base oxide 10 and the base region 3. For about 20 nm, the concentration of the first dopant is at about $3*10^{19}/cm^3$. Between 20 nm and about 65 nm, the concentration is lower than $3*10^{19}/cm^3$ and at about $1*10^{18}/cm^3$. At 65 nm depth, the concentration rises again to about $3*10^{19}/cm^3$ over a length of about 5 nm. Beyond a depth of 70 nm, the concentration is insignificant. The concentration of Germanium is also indicated, but not relevant for the present invention. The first region 11 of high concentration is provided for forming the active base region. The second region 12 of high concentration is the additional surface doping in accordance with aspects of the invention.

Figure 3:
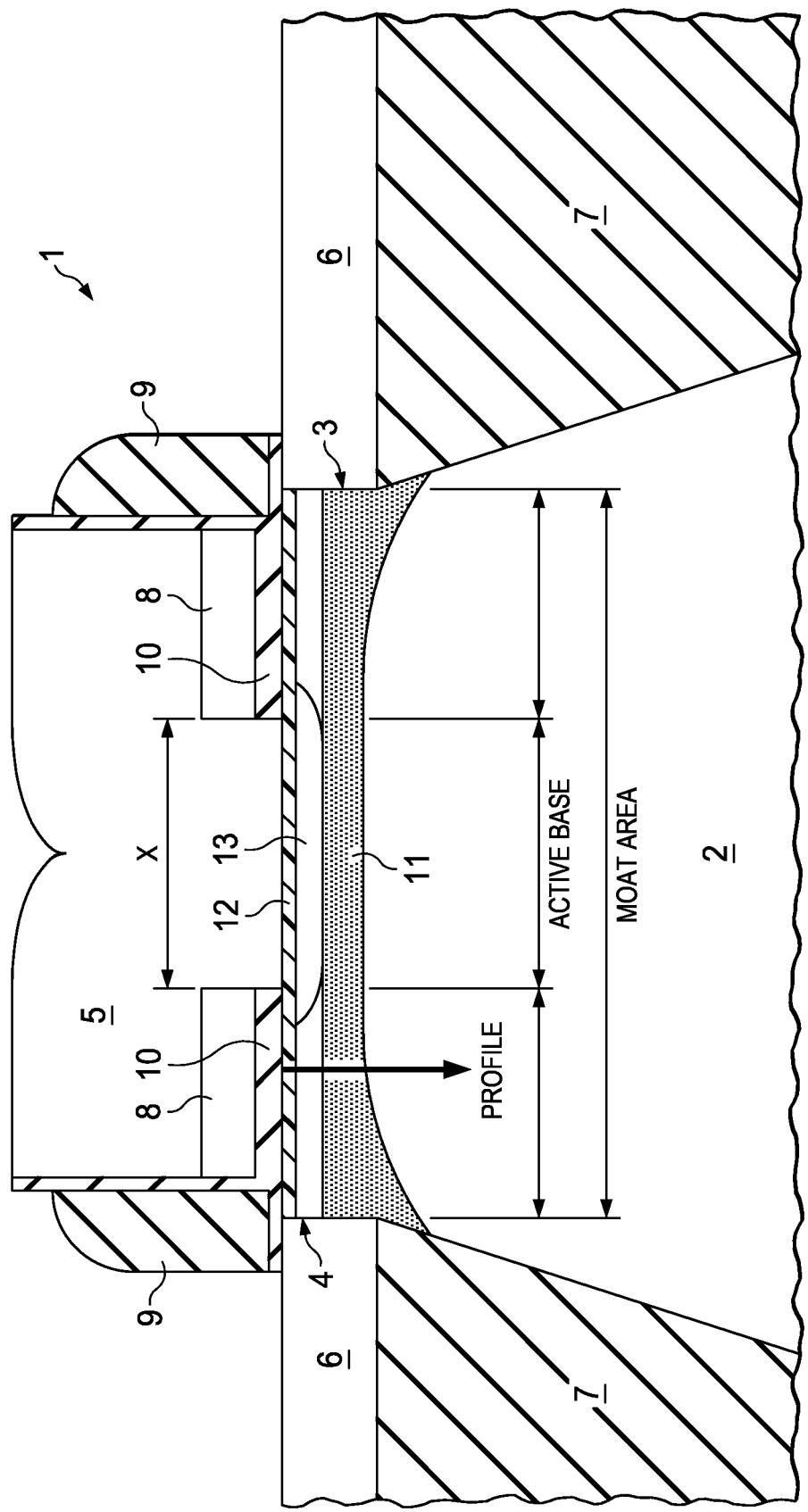
FIG. 3 is a cross-sectional diagram through a bipolar transistor according to an embodiment of the invention.

FIG. 3 is a cross-sectional diagram through a bipolar transistor according to an embodiment of the invention. The arrow in FIG. 3 indicates the line along which the magnitude of the first dopant is depicted in FIG. 2. In this embodiment, the profile of the first dopant (phosphorous for N-type doping) is adapted in order to eliminate the negative effects of electrons trapped in the base oxide 10. There are two regions 11 and 12 with an increased amount of doping. The first region 11 is provided for forming the active region of the base region 3. The second region 12 is a surface doping of the base moat region 3. The first region 11 and the second region 12 are separated by a region 13 in which the doping is reduced compared with regions 11 and 12. The increased amount of N-type (first dopant) doping at the surface prevents inversion and therefore the undesired expansion of the emitter into the base. This is particularly relevant, if the distance (horizontal in FIG. 3) between the emitter region 4 and the shallow trench regions 6 is short. In this embodiment the parameter X, indicates the diameter of the emitter and is 0.3 μm. The emitter dopant is a dopant of a second type (P-type). The doping of the emitter is substantially (at least one order of magnitude) greater than the doping of the first type. This means that the surface doping can be applied over the whole surface of the moat area including base region 3 and emitter region 4. The doping of the first type for the base region 3 is then "overwritten" by the stronger doping with the dopant of the second type.

In an embodiment of the invention, the concentration in the second region can be between $5*10^{13}/cm^3$ and $5*10^{19}/cm^3$, and in particular $3*10^{19}/cm^3$. For a PNP transistor, the first dopant can be phosphorous. The second region of high concentration of the first dopant extends from the transition between the base (moat) oxide and the base into the base. The depth of the second region can be between 5 nm and 25 nm, and in particular equal to or less than 20 nm. The above parameters are chosen such that the current gain, the transit frequency (ft) and breakdown parameters remain within the required ranges. The aspects of the invention provide that the parameters of the technology can basically remain unchanged.

In terms of a method of manufacturing an electronic device and in particular a bipolar transistor in accordance with the aspects of the invention, there is a first doping step of the base region with a first dopant for forming the active base region 11 having a first concentration of the first dopant. The region 11 extends over the whole width referred to as the moat area. Furthermore, there is a second doping step of the base region with the first dopant for providing an additional surface doping 12 of the base moat region 3 with a second concentration of the first dopant. The first and second doping steps are performed such that the two doping regions 11 and 12 are separated from each other by a region 13 of reduced concentration (third concentration). The first and the second concentration of the first dopant can be about the same. The third concentration can be at least an order of magnitude less than the order of magnitude of the first and of the second concentration.

Figure 4:
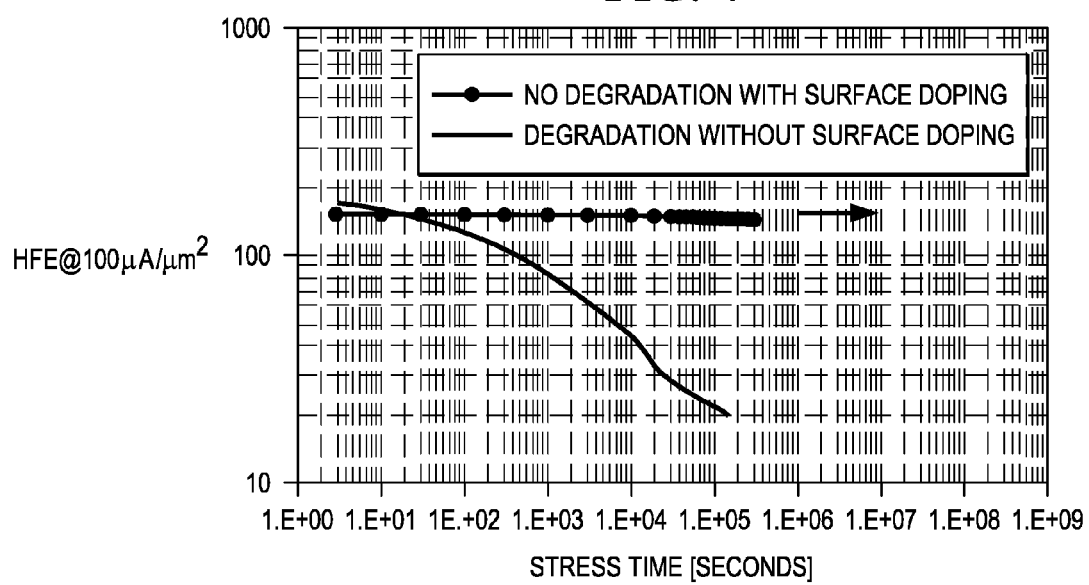
FIG. 4 is a comparative diagram showing the degradation of the current gain with and without using a doping profile according to aspects of the invention.

FIG. 4 is a comparative diagram showing the degradation of the current gain with and without using a doping profile according to aspects of the invention. The emitter current 1E is at about 400 μA/μm². The stress-time reaches from 0 seconds to about 1 to $2*10^5$ seconds. The current gain HFE is indicated over the stress time and the collector-emitter voltage VCE is about 7 V. It can be seen that surface doping in accordance with the invention substantially prevents any degradation (decrease) of the current gain HFE.

Although the invention has been described hereinabove with reference to specific embodiments, it is not limited to these embodiments and no doubt further alternatives will occur to the skilled person that lie within the scope of the invention as claimed.

The invention claimed is:

1. An electronic device comprising a bipolar transistor having an emitter region, a base region, and a collector region, wherein the base region comprises:
   a first region of a first concentration of a first dopant for forming an electrically active base region of the bipolar transistor; and
   a second region of a second concentration of the first dopant at a surface of the base region, wherein the first region is separated from the second region by a third region of a third concentration of the first dopant, the third concentration being lower than the first concentration and the second concentration, wherein the first region is vertically separated from the second region by the third region.

2. The electronic device according to claim 1, wherein the second region is adjacent to a base moat oxide interface and the first region is adjacent the collector.

3. The electronic device according to claim 1, wherein the second region and the first region have about the same concentration of the first dopant.

4. The electronic device according to claim 1, wherein the emitter has a concentration of a second dopant that is substantially greater than the concentration of the first dopant in the second region.

5. The electronic device according to claim 1, wherein the third concentration is at least an order of magnitude less than the first concentration and the second concentration.

6. The electronic device according to claim 1, wherein the first concentration and the second concentration are on the same order of magnitude.

7. A method of manufacturing an electronic device comprising a bipolar transistor, the method comprising:
- performing a first doping step to dope the base region of the bipolar transistor with a first dopant for forming an electrically active base region having a first concentration of the first dopant; and
- performing a second doping step to dope the base region again with the first dopant for providing an additional surface doping of the base region with a second concentration of the first dopant, such that two doping regions are separated from each other by a region of a third concentration being lower than the first concentration of the first dopant and being lower than the second concentration, wherein the two doping regions of the base region are vertically separated by the region of the third concentration.

8. The method according to claim 7, wherein the third concentration is at least an order of magnitude less than the order of magnitude of the first concentration and of the second concentration.

9. A method of manufacturing an electronic device comprising a bipolar transistor, the method comprising:
- forming isolation regions to define a moat area of the bipolar transistor;
- performing a first doping step to dope the base region of the bipolar transistor with a first dopant for forming an electrically active base region having a first concentration of the first dopant;
- performing a second doping step to dope the base region again with the first dopant for providing an additional surface doping across an entire surface of the moat area with a second concentration of the first dopant, such that two doping regions are separated from each other by a region of a third concentration being lower than the first concentration of the first dopant and being lower than the second concentration; and
- performing a third doping step with a second dopant having a conductivity type opposite the first dopant to form an emitter region within lateral dimensions of the base region such that the doping of the first dopant from the first and second doping steps is overwritten with the second dopant within the emitter region, wherein the two doping regions of the base region are vertically separated by the region of the third concentration.

* * * * *